United States Patent [19]
Matsumoto et al.

[11] Patent Number: 5,359,539
[45] Date of Patent: Oct. 25, 1994

[54] LOGIC DESIGN SYSTEM AND CIRCUIT TRANSFORMATION RULE COMPILER

[75] Inventors: Noriko Matsumoto, Kyoto; Tamotsu Nishiyama, Osaka, both of Japan

[73] Assignee: Matsushita Electric Industrial Co., Ltd., Osaka, Japan

[21] Appl. No.: 52,240

[22] Filed: Apr. 20, 1993

Related U.S. Application Data

[63] Continuation of Ser. No. 571,365, Aug. 23, 1990, abandoned.

[30] Foreign Application Priority Data

Sep. 7, 1989 [JP] Japan .................. 1-233761

[51] Int. Cl.$^5$ .............................................. G06F 15/60
[52] U.S. Cl. ...................................... 364/489; 364/488
[58] Field of Search .............. 364/488, 489, 490, 491; 395/600, 650

[56] References Cited

U.S. PATENT DOCUMENTS

| | | | |
|---|---|---|---|
| 4,651,284 | 3/1987 | Watanabe et al. | 364/491 |
| 4,700,317 | 10/1987 | Watanabe et al. | 364/488 |
| 4,703,435 | 10/1987 | Darringer et al. | 364/489 |
| 4,833,619 | 5/1989 | Shimizu et al. | 364/489 |
| 4,896,272 | 1/1990 | Kurosawa | 364/491 |
| 4,922,432 | 5/1990 | Kobayashi et al. | 364/490 |
| 4,942,536 | 7/1990 | Watanabe et al. | 364/490 |
| 5,031,111 | 7/1991 | Chao et al. | 364/491 |
| 5,038,294 | 8/1991 | Arakawa et al. | 364/491 |
| 5,041,986 | 8/1991 | Tanishita | 364/489 |
| 5,067,091 | 11/1991 | Nakazawa | 364/490 |

FOREIGN PATENT DOCUMENTS 59-168545 9/1984 Japan .

OTHER PUBLICATIONS

"Inside an Expert System" by B. A. Thompson et al., BYTE, Apr. 1985, pp. 315–330.
"Methods Used in an Automatic Logic Design Generator (Alert)" by T. D. Friedman et al., IEEE Trans. on Computer, vol. C-18, No. 7, Jul. 1969, pp. 593–614.
"Experiments in Logic Synthesis" by J. A. Darringer et al., IEEE-ICCC 1980, pp. 234–237A.
"A Rule-Based System for Optimizing Combination Logic" by A. J. de Geus et al., IEEE Design & Test 1985, pp. 22–32.

*Primary Examiner*—Vincent N. Trans
*Attorney, Agent, or Firm*—Lowe, Price, LeBlanc & Becker

[57] ABSTRACT

A plurality of types of circuit transformation rules have condition parts and conclusion parts. An inference control knowledge includes a knowledge related to a method of inferring the circuit transformation rules and a knowledge related to a relation between the circuit transformation rules. The circuit transformation rules are compiled into circuit transformation programs by use of the inference control knowledge. Already-existing programs include a procedural process of a logic design and various functions necessary for an execution of the circuit transformation programs. The circuit transformation programs and the already-existing programs are combined into a logic design program. A circuit transformation process is executed in accordance with the logic design program.

6 Claims, 9 Drawing Sheets

LOGIC DESIGN SYSTEM AND CIRCUIT TRANSFORMATION RULE COMPILER

This application is a continuation of application Ser. No. 07/571,365 filed Aug. 23, 1990 now abandoned.

BACKGROUND OF THE INVENTION

This invention generally relates to a designing of an integrated circuit (IC) or a large-scale integrated circuit (LSI), and specifically relates to a logic design wherein a functional description is transformed into a logic circuit, which is in turn transformed into a circuit of actual elements. This invention also relates to a method of and apparatus for compiling circuit transformation rules which are usable in such a logic design system.

Generally, a top-down technique is used in a designing of an LSI. In such a top-down technique, the details of required functions are initially established and then a structure corresponding to the required functions is written in a primitive logic circuit which is transformed into an actual circuit composed of actual elements.

Computer based design systems are often used in designing an LSI based on a top-down technique. The computer-based design system uses a higher computer language such as "Prolog" or "C" to transform a description of functions by a higher into a logic circuit level and to transform the logic circuit level into an actual circuit level.

In a collection of papers related to lectures at a National Meeting of Japanese Society of Information Processing, 1985, pages 1923–1926, a circuit transformation technology is described in which a logic circuit containing imaginary logic elements is transformed into a logic circuit composed of only actual logic elements. Specifically, a prior-art logic design system based on this circuit transformation technology prestores information of logic elements containing imaginary logic elements, and information about the relations between the logic circuits and corresponding actual logic circuits. The latter information is called "circuit transformation information". When information of a logic circuit containing imaginary logic elements is supplied to the logic design system, the logic design system executes the following processes. The respective logic elements of the input logic circuit are collated with the prestored logic elements, and actual logic circuits are sequentially generated for the respective logic elements of the input logic circuit by referring to the circuit transformation information. The input logic element and its fan out are considered in the generation of a corresponding actual logic circuit.

The above-mentioned prior-art logic design system has the following problem. Since the transformation of each input logic element into a corresponding actual logic circuit is fixed, a circuit transformation can not be performed in consideration of the observation of a synthetic circuit structure. Accordingly, the actual logic circuits tend to be more redundant than that obtained by a skilled circuit designer.

This problem of the prior-art logic design system is resolved by a logic design system disclosed in Japanese published unexamined patent application 59-168545. The logic design system of Japanese patent application 59-168545 prestores information related to a skilled circuit designer's knowledge of optimizing a circuit transformation in dependence on conditions of connections of logic elements. A circuit transformation process is performed by referring to this knowledge base, and thus the optimization of the circuit transformation is realized.

The knowledge base has components which correspond with respective logic elements containing imaginary logic elements. Each component of the knowledge base includes a combination of circuit transformation rules. Each circuit transformation rule has a condition part and a conclusion part. The condition part relates to connection conditions in an input logic element. The conclusion part relates to circuit transformation operations corresponding to the condition part. During execution of the circuit transformation process, with respect to an input logic element, reference is made to the knowledge base component corresponding to the input logic element. Subsequently, the circuit transformation rules forming the component of the knowledge base are successively analyzed by an interpreter, and connection conditions in the input logic element are sequentially collated with the condition parts of the circuit transformation rules to find the condition part of the circuit transformation rule which matches the connection conditions of the input logic element. Finally, the circuit transformation is performed in accordance with the conclusion part of the circuit transformation rule whose condition part matches the connection conditions of the input logic element.

The logic design system of Japanese patent application 59-168545 has the following problems. Since the circuit transformation rules are successively analyzed by the interpreter, the circuit transformation process speed tends to be low. In addition, a direct description of the circuit transformation inference algorithm is difficult.

SUMMARY OF THE INVENTION

It is a first object of this invention to provide a logic design system which can perform a circuit transformation process at a high speed.

It is a second object of this invention to provide a good apparatus for compiling circuit transformation rules.

It is a third object of this invention to provide a good method of compiling circuit transformation rules.

According to a first aspect of this invention, a logic design system for transforming input circuit information into other circuit information closer to an actually-provided element level comprises means for storing a plurality of types of circuit transformation rules having condition parts and conclusion parts; means for storing an inference control knowledge including a knowledge related to a method of inferring the circuit transformation rules and a knowledge related to a relation between the circuit transformation rules; means for compiling the circuit transformation rules into circuit transformation programs by use of the inference control knowledge; means for storing the circuit transformation programs; means for storing already-existing programs including a procedural process of a logic design and various functions necessary for an execution of the circuit transformation programs; means for combining the circuit transformation programs and the already-existing programs into a logic design program; means for storing the logic design program; and means for executing a circuit transformation process in accordance with the logic design program.

A second aspect of this invention provides a circuit transformation compiling apparatus for compiling circuit transformation rules into circuit transformation programs by use of an inference control knowledge, the circuit transformation rules having condition parts and conclusion parts, the inference control knowledge including a knowledge related to a method of inferring the circuit transformation rules and a knowledge related to a relation between the circuit transformation rules, the circuit transformation programs being used for a circuit transformation process, the apparatus comprising first analyzing means for analyzing the condition parts of the circuit transformation rules; second analyzing means for analyzing the inference control knowledge; means for storing a result of the analyzing by the first analyzing means and a result of the analyzing by the second analyzing means; and means for generating the circuit transformation programs on the basis of the result of the analyzing by the first analyzing means, the result of the analyzing by the second analyzing means, the circuit transformation rules, and the inference control knowledge.

A third aspect of this invention provides a circuit transformation method wherein circuit transformation rules are computed into circuit transformation programs by use of an inference control knowledge. The circuit transformation rules have condition parts and conclusion parts. The inference control knowledge includes knowledge related to a method of inferring the circuit transformation rules and knowledge related to a relation between the circuit transformation rules. The circuit transformation programs are used for a circuit transformation process. The method comprises the steps of analyzing the condition parts of the circuit transformation rules and the inference control knowledge; and generating the circuit transformation programs on the basis of the analyzing result, the circuit transformation rules, and the inference control knowledge.

DESCRIPTION OF THE PREFERRED EMBODIMENT

Figure 1:
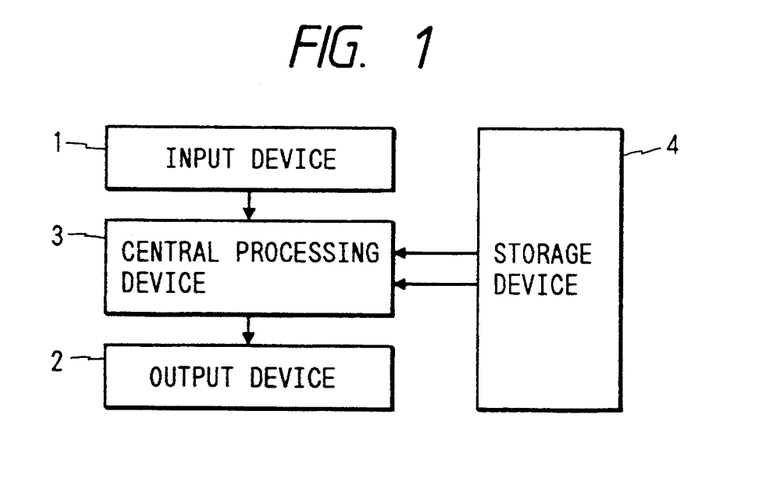
FIG. 1 is a block diagram of a logic design system according to an embodiment of this invention.

With reference to FIG. 1, a logic design system includes an input device 1, an output device 2, a processing device 3, and a storage device 4. The device 1, the output device 2, and the storage device 4 are connected to the central processing device 3.

The input device 1 is used for inputting information into the central processing device 3. The input information includes information related to a circuit such as a logic circuit which is an object to be exposed to a circuit transformation, and information related to a description of functions to be executed by a higher computer language such as "Prolog" or "C". The central processing device 3 processes the input information and executes a circuit transformation process to obtain information or data representative of a target circuit in accordance with various programs stored in the storage device 4. The target circuit has the same functions as the functions of the input transformation-object circuit, and is composed of actual elements. The output device 2 is used for outputting the information of the target circuit which is obtained by the central processing device 3.

The input device 1 includes a suitable device such as a card reader, a schematic entry system, or a file. The output device 2 includes a suitable device such as a graphic display, a plotter, or a file. The central processing device 3 includes a suitable device such as a general computer, an engineering work station, or a personal computer.

Figure 2:
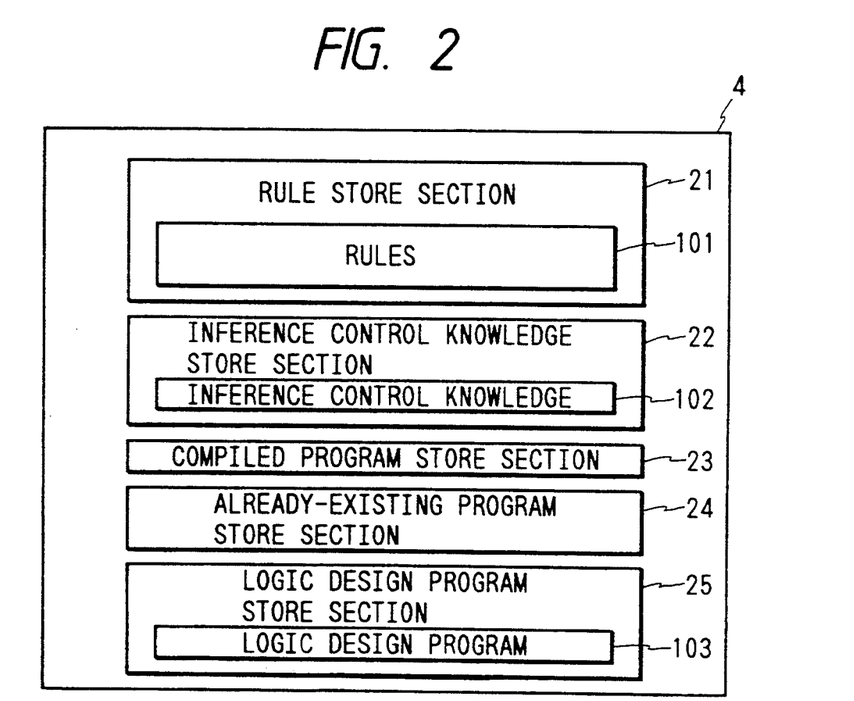
FIG. 2 is a diagram of the storage device of FIG. 1.

As shown in FIG. 2, the storage device 4 includes sections 21-25. The section 21 stores information related to circuit transformation rules 101 used for a circuit transformation. The section 22 stores information related to knowledge inference control 102. The inference control knowledge 102 relates to a method of inferring circuit transformation rules or rule groups, and the relations between the circuit transformation rules or the relations between the rule groups such as application orders and a method of removing a competition. The section 23 stores compiled programs. The section 24 stores already-existing programs. The section 25 stores logic design programs 103. The compiled program store section 23 and the already-existing program store section 24 are used in the generation of the logic design programs 103.

The already-existing programs stored in the section 24 of the storage device 4 include various programs which are coded in a programming language such as "Prolog", "Lisp", or "C" Specifically, the already-existing programs include programs for executing various procedural processes of a logic design, various functions, calculations, and judgments used in the circuit transformation programs.

Figure 3:
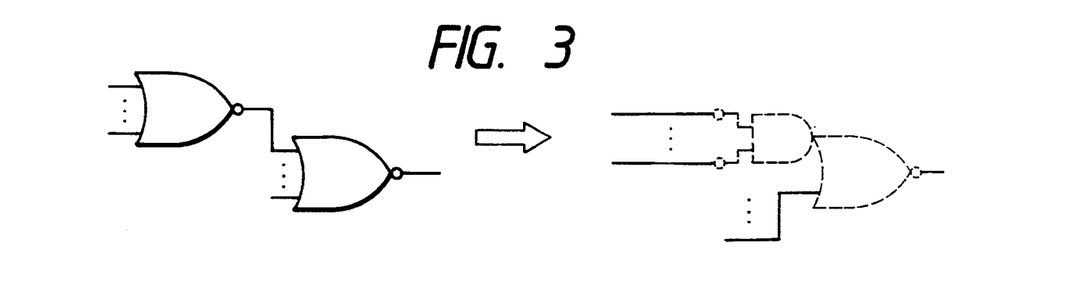
FIGS. 3-6 are diagrams of examples of circuit transformation rules.
Figure 4:
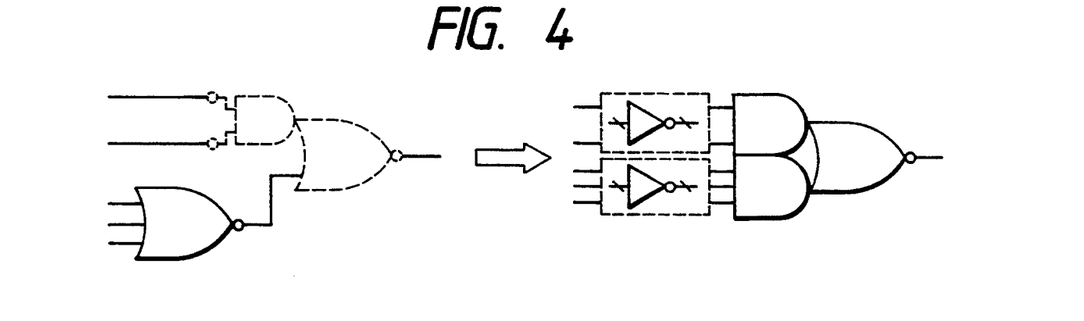
Figure 5:
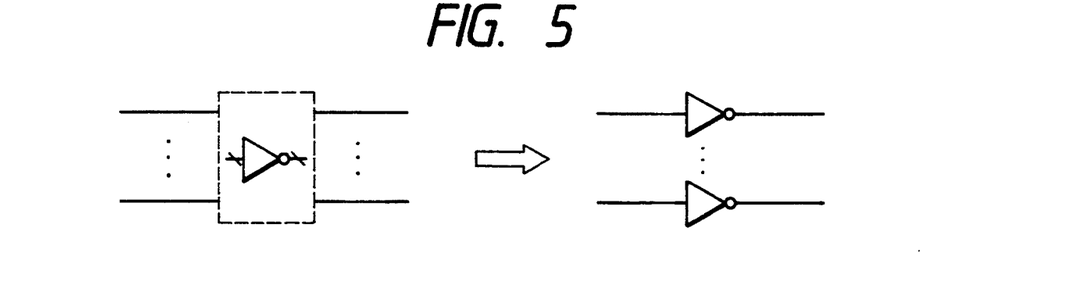

FIGS. 3-5 are examples of the circuit transformation rules 101 stored in the section 21 of the storage device 4. These examples are rules of an if-then type which are used for the transformation of a logic circuit containing imaginary logic elements into an actual logic circuit composed of only actual logic elements such as CMOS transistors and standard cells. The actual logic circuit is logically equivalent to the original logic circuit containing the imaginary logic elements.

FIG. 3 shows a main rule including a general rule that "if an output of a NOR gate having a fan out equal to 1 is connected with another NOR gate, then a rule for the transformation into a composite AND-NOR gate is applied".

FIG. 4 shows a sub rule including a rule for the transformation into a composite AND-NOR gate, or a local rule that "if the inputs of a 2-input NOR gate are connected with a 2-input NOR gate and a 3-input NOR gate respectively, then the transformation into standard cells antdOO and inverter elements connected to respective inputs is performed". In FIG. 4, the inverter elements connected to the respective inputs are expressed by logic-inversion simplified macro elements (imaginary elements) having bit widths of 2 bits and 3 bits respectively.

FIG. 5 shows an expansion rule for expanding an imaginary macro element in actual elements, or a rule for transforming a logic-inversion macro element having a bit width of plurality of bits into actual inverters for the respective bits.

In some cases, the section 21 of the storage device 4 stores circuit transformation rules in the form of rule groups dependent on the types of the circuit transformation rules.

The circuit transformation rules include rules such as the previously-mentioned rules for the transformation between logic circuits and for the transformation of a logic circuit into an actual logic circuit composed of only actual logic elements. In addition, the circuit transformation rules may include rules used in any stages of a logic design, such as rules for transforming a circuit expressed by a description of functions into a logic circuit, or rules for transforming a logic circuit of actual elements into another logic circuit of actual elements.

Figure 6:
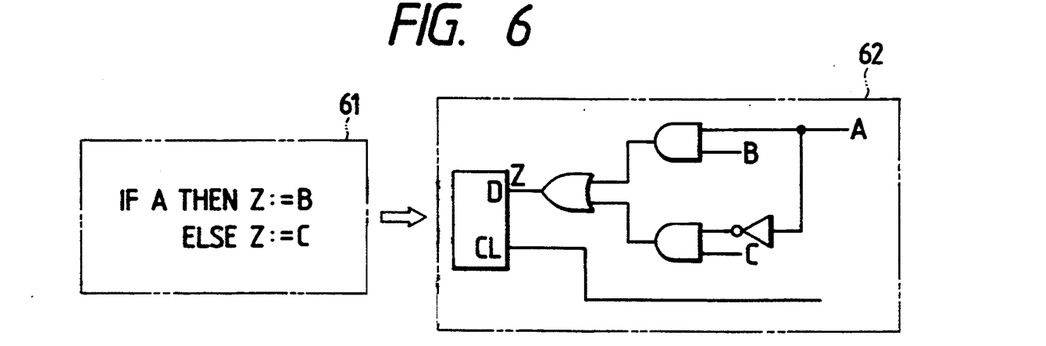

FIG. 6 shows an example of a rule for transforming a circuit expressed by a description off functions into a logic circuit. The rule of FIG. 6 has a condition part 61 and a conclusion part 62. The condition part 61 includes a description of functions in a register transfer level which represents that "a signal B is inputted into a register z when a signal A is active, and a signal C is inputted into the register z when it is inactive".

Figure 7:
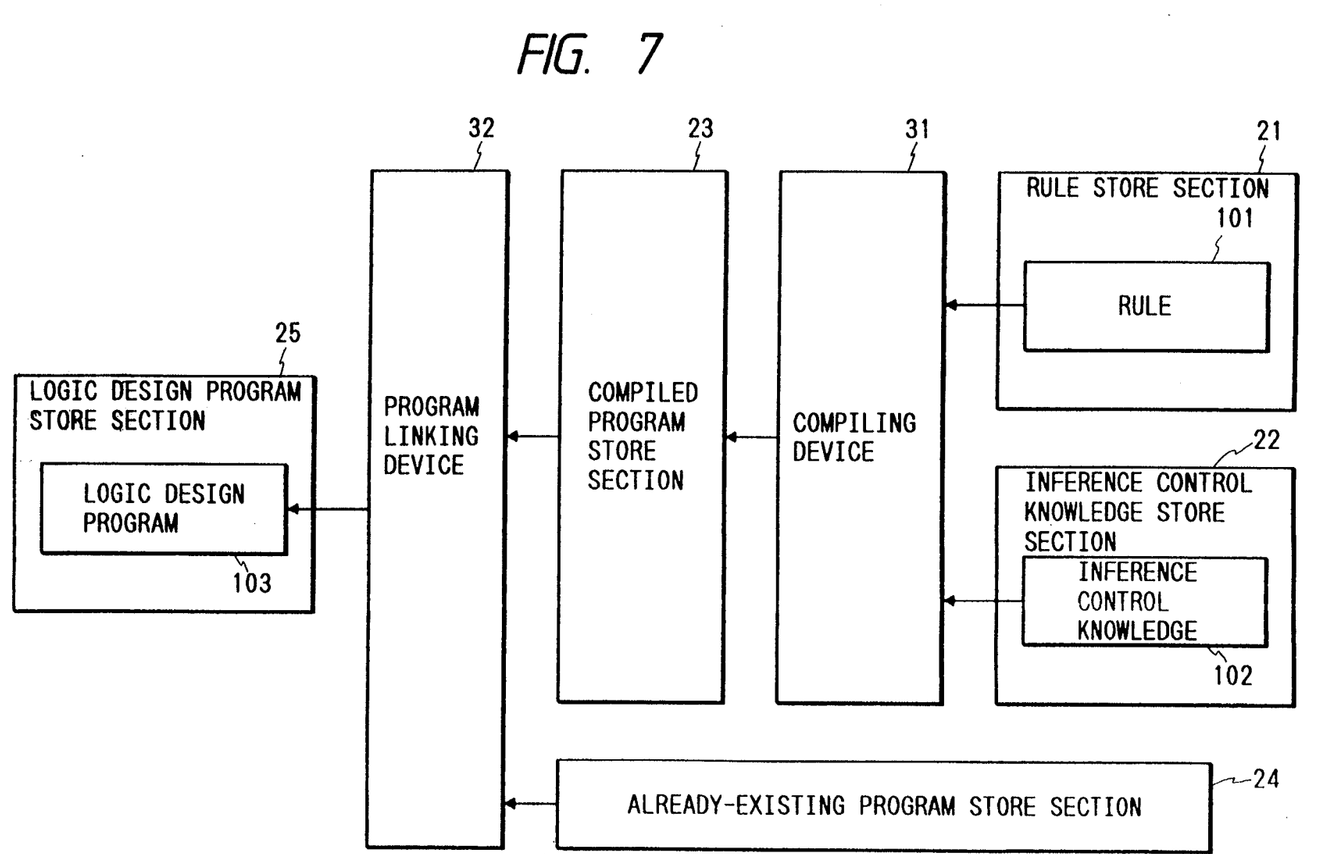
FIG. 7 is a more detailed diagram of the logic design system of FIG. 1.

FIG. 7 shows the flow of the operation for generating the logic design programs 103 which is executed in the logic design system. Circuit transformation rules 101 of a plurality of types which are stored in the section 21 of the storage device 4 are translated by a compiling device 31 into circuit transformation programs by referring to the inference control knowledge 102 stored in the section 22 of the storage device 4. The inference control knowledge 102 relates to a method of inferring circuit transformation rules and the relation between the circuit transformation rules. The circuit transformation programs generated by the compiling device 31 are stored into the section 23 of the storage device 4. The circuit transformation programs stored in the section 23 of the storage device 4 are linked by a program linking device 32 with the already-existing various programs stored in the section 24 of the storage device 4. The already-existing programs stored in the section 24 of the storage device 4 relate to a procedural process of the logic design and various functions used in the circuit transformation programs. A resultant of the program linkage by the program linking device 32 is logic design programs which are stored into the section 25 of the storage device 4. During the linkage of programs at a source level, an execution form (or a load module) of a program being a result of the linkage is made by use of a linkage loader, and the newly-made execution form and an already-existing execution form are combined into a single by use of a suitable command such as a shell command. Therefore, the logic design programs 103 stored in the section 25 of the storage device 4 are in an execution form expressed by a programming language such as "Prolog", "Lisp", or "C". should be noted that the compiling device 31 and the program linking device 32 are formed by the central processing device 3 of FIG. 1.

Figure 8:
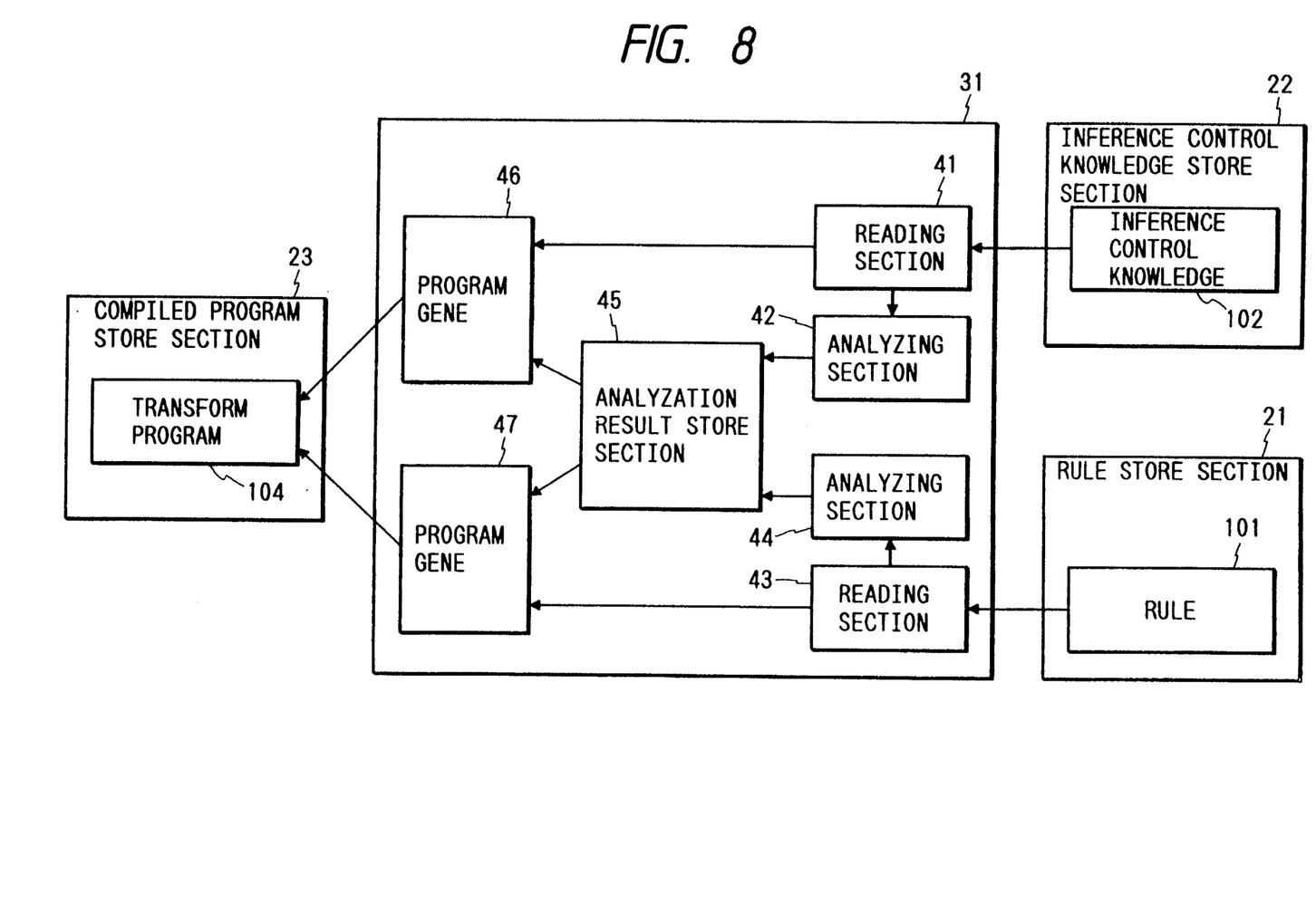
FIG. 8 is a diagram of the compiling device of FIG. 7.

As shown in FIG. 8, the compiling device 31 includes sections 41–47. The circuit transformation rules 101 are read out from the section 21 of the storage device 4 and are inputted into the compiling device 31 via a reading section 43. The circuit transformation rules 101 are fed from the reading section 43 to an analyzing section 44 and a program generating section 47. The analyzing section 44 analyzes the condition parts of the circuit transformation rules 101. The result of the analyzation by the analyzing section 44 is stored into a store section 45. The result of the analyzation of the condition parts of the circuit transformation rules 101 is fed from the store section 45 to the program generating section 47. The program generating section 47 generates transformation programs corresponding to the circuit transformation rules 101 on the basis of the result of the analyzation of their condition parts. The inference control knowledge 102 is read out from the section 22 of the storage device 4 and is inputted into the compiling device 31 via a reading section 41. The inference control knowledge 102 is fed from the reading section 41 to an analyzing section 42 and a program generating section 46. The analyzing section 42 analyzes the inference control knowledge 102. The result of the analyzation by the section 42 is stored into the store section 45. The result of the analyzation of the inference control knowledge 102 is fed from the store section 45 to the program generating section 46. The program generating section 46 generates control programs on the basis of the inference control knowledge 102 and the result of its analyzation. The control programs are used for controlling an inference in the circuit transformation. The control programs and the transformation programs generated by the program generating sections 46 and 47 are stored into the section 23 of the storage device 4 as circuit transformation programs 104. The circuit transformation programs 104 are used for the collation between the condition parts of the circuit transformation rulers and circuit information inputted into the logic design system. In this case, programming processes corresponding to the respective circuit transformation rules are selected and executed in accordance with the above-mentioned control programs so that the application of the circuit transformation rules based on the inference control knowledge is enabled.

Figure 9:
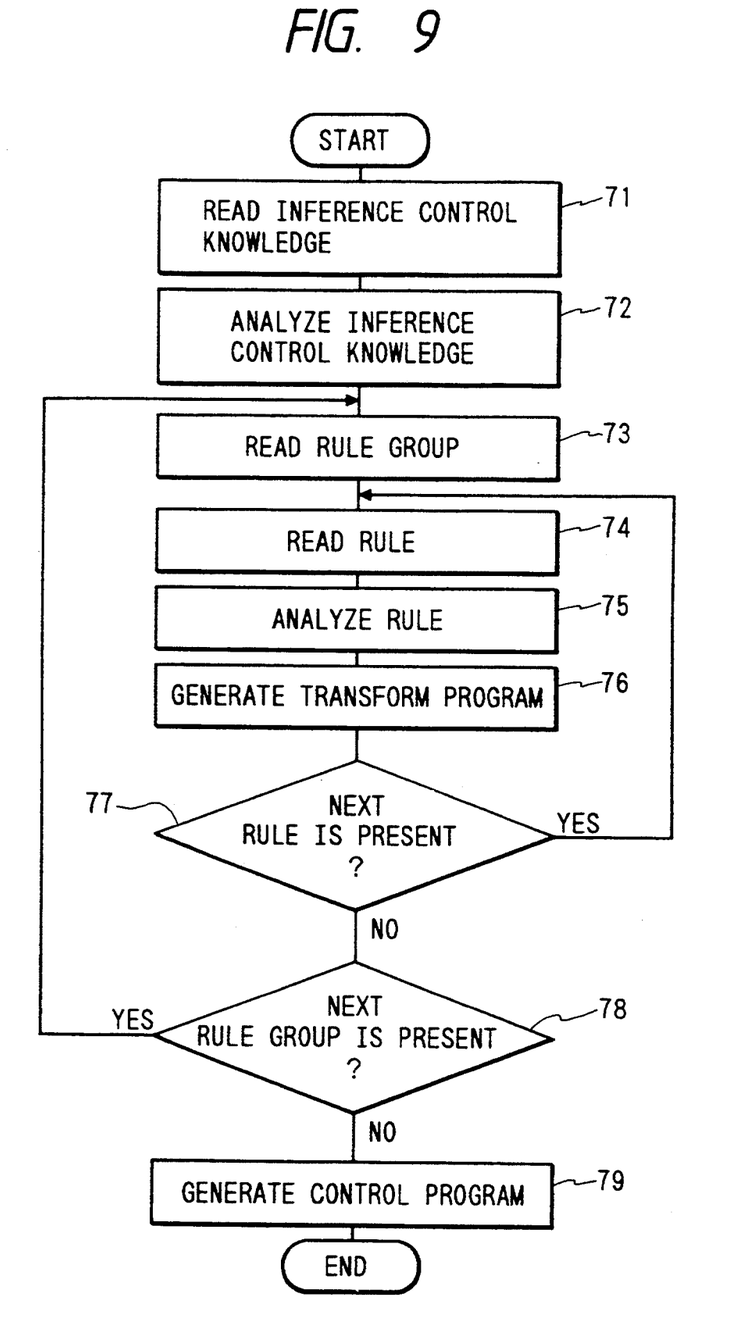
FIG. 9 is a flowchart of a process executed by the compiling device of FIG. 8.

FIG. 9 is a flowchart of the compiling process executed by the compiling device 31. A first step 71 reads out the inference control knowledge 102 from the section 22 of the storage device 4 by use of the reading section 41. A step 72 following the step 71 analyzes the inference control knowledge 102 by use of the analyzing section 42. The step 72 stores the result of the analyzation of the inference control knowledge 102 into the store section 45. The result of the analyzation of the inference control knowledge 102 is information necessary for the compiling of the circuit transformation rules, such as the application order of the circuit transformation rules or the rule groups, and the method of inferring the circuit transformation rules or the rule groups. After the step 72, the process advances to a step 73.

The step 73 reads out the circuit transformation rule groups from the section 21 of the storage device 4 by use of the reading section 43. After the step 73, The process advances to a step 74 which reads or selects the circuit transformation rules from the circuit transformation rule groups obtained by the preceding step 73. A step 75 following the step 74 analyzes the condition parts of the circuit transformation rules by use of the analyzing section 44. Specifically, the step 75 executes a process of expanding the condition-part rules in the elements shown in the condition parts of the circuit transformation rules, and a process of deciding removed elements and reference elements. The step 75 stores the result of the analyzation of the condition parts of the circuit transformation rules into the store section 45.

The step 76 judges the application conditions of the circuit transformation rules by referring to the result of the analyzation of the condition parts of the circuit transformation rules and the inference method of the circuit-transformation rules which are stored in the store section 45. When the result of the judgment means the allowance of the application, the step 76 generates a transformation program to execute a circuit transformation for each of the rules. In some cases, when programs are written out, the inference control knowledge and the circuit transformation rules read out by the steps 71 and 74 are directly referred to.

A step 77 following the step 76 judges whether or not a circuit transformation rule subsequent to the currently-processed circuit transformation rule is present in the circuit transformation rule groups read out by the step 73. When the subsequent circuit transformation rule is present, the process returns from the step 77 to the step 74. In this case, the subsequent circuit transformation rule is read out by the step 74. When the subsequent circuit transformation rule is absent, the process advances to a step 78. The step 78 judges whether or not a circuit transformation rule group subsequent to the currently-processed circuit transformation rule group is present in the section 21 of the storage device 4. When the subsequent circuit transformation rule group is present, the process returns from the step 78 to the step 73. In this case, the subsequent circuit transformation rule group is read out from the section 21 of the storage device 4 by the step 73. When the subsequent circuit transformation rule group is absent, the process advances to a step 79. The step 79 generates control programs by use of the program generating section 46. Specifically, the control programs are generated on the basis of the result of the analyzation of the inference control knowledge which is obtained by the step 72. As described previously, the result of the analyzation of the inference control knowledge is the information related to the relation between the circuit transformation rule groups such as the hierarchical structure of the rules and the application order of the rule groups. The generated control programs determine the readout of the transformation programs in accordance with the sequence of the circuit transformation. The transformation programs are generated by the step 76. The transformation programs and the control programs generated by the steps 76 and 79 are stored into the section 23 of the storage device 4 as circuit transformation programs 104.

The process flow of FIG. 9 may be modified as follows. In a first modification, the operation by the step 72 is executed in the step 71. In a second modification, the operation by the step 75 is executed in the steps 73 and 74. In a fourth modification, the operation by the step 72 is executed in the step 79. In a fifth modification, the operation by the step 75 is executed in the step 76.

Figure 10:
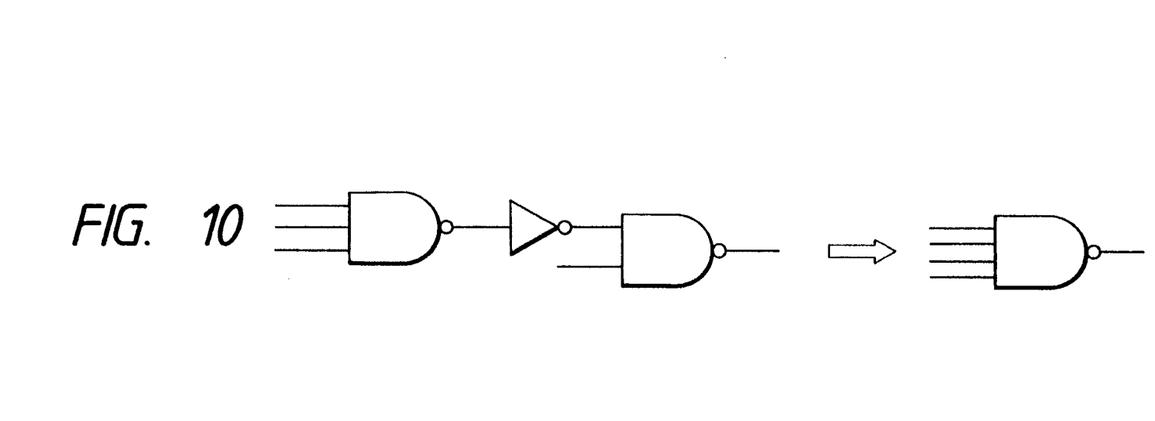
FIG. 10 is a diagram of an example of a circuit optimizing transformation rule.

The process of FIG. 9 is realized by use of the higher programming language "Prolog" as described hereinafter. Firstly, an example of the description of the circuit transformation rules 101 in the section 21 of the storage device 4 will be explained with reference to FIG. 10. FIG. 10 shows a circuit transformation rule that "if an input of an inverter element having a fan out equal to 1 and connected to an input of a NAND element is connected to another NAND element and if a composite is enabled, then the input is transformed into a combined NAND element". The circuit transformation rule of FIG. 10 relates to circuit optimization.

Figure 11:
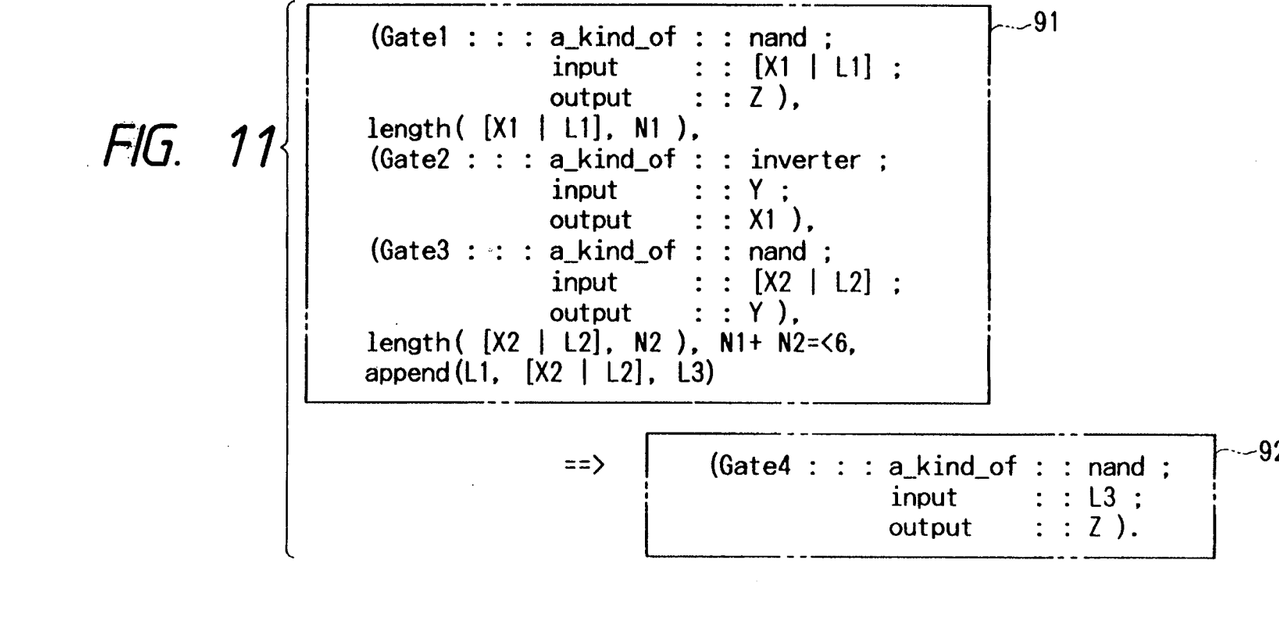
FIG. 11 is a diagram of the circuit optimizing transformation rule of FIG. 10 which uses a higher computer language.

FIG. 11 shows an example of the description of the circuit transformation rule of FIG. 10. The example of FIG. 11 expresses the circuit transformation rule in a format such as "the condition part 91→the conclusion part 92". In the example of the FIG. 11, the conclusion part 92 of the circuit transformation rule does not describe the operation of the circuit transformation which is executed when the condition part 91 of the circuit transformation rule is satisfied, but the conclusion part 92 describes only the pattern of the circuit data which are added or changed as the result of the circuit transformation. The conclusion part may describe the operation of the circuit transformation. While the rule that "A is transformed into B" is expressed as "A→B" in the example of FIG. 11, the rule may be expressed as "A→A is replaced by B".

In the example of FIG. 11, the condition part 91 and the conclusion part 92 contain elements which are added and removed when the condition part 91 is satisfied. The added and removed elements are represented by identifiers for identifying elements, attribute codes, and attribute values. An attribute code and an attribute value in a pair are written in opposite sides of the character "::" respectively. Pairs of attribute codes and attribute values are separated by the characters ";". Identifiers are separated from other data by the characters ":::". The attribute codes include "$a_{13}$ kind_of" representing the kind of an element, "input" representing the name of an input signal, and "output" representing the name of an output signal. The first paragraph of the condition part 91 of FIG. 11 represents a NAND element whose identifier is "Gate1", whose input is "[X1|L1]", and whose output signal is "Z".

In FIG. 11: "length (L, N)" is a cut-in predicate of "Prolog" which means that the length of a list L is N; "N1+N2=<N3" is a cut-in predicate of "Prolog" which judges whether or not the sum of the N1 and N2 is smaller than N3; and "append (L1, L2, L3)" is a cut-in predicate of "Prolog" which obtains the combined list of the list L1 and list L2 in L3.

The process of generating the transformation programs will be explained hereinafter. As described previously, the circuit transformation rule is read out by the step 74 of FIG. 9, and the condition part of the readout circuit transformation rule is analyzed by the step 75 of FIG. 9 which uses the analyzing section 44. The analyzing step 75 is realized by the Following program using "Prolog".

--- expand_left((P1,P2),(L1,L2),(DL1,DL3)) :-!,

```
        expand_left(P1,L1,(DL1,DL2)),
        expand_left(P2,L2,(DL2,DL3)).
expand_left((Gate_name:::Slots),
        unify_frame(Slots,Gate_name),
        ([Gate_name | DL],DL)) :-!.
expand_left((?P,L1,(DL,DL)) :-!,
        expand_left(P,L1,(_,[])).
expand_left((not P), not(L1), (DL,DL)) :-!,
        expand_left(P,L1,(_,[])).
expand_left(P,P,(DL,DL)).
```

In the above-mentioned program, the first paragraph means that the condition part of a circuit transformation rule is recurrently processed one-term by one-term, and the second paragraph means the following process. When the term of the rule condition-part in the first argument represents an element, the identifier and the attribute of the element are placed into the argument of "unify$_{13}$ frame" being a predicate for executing the judgment collation between data and the element in the rule in the transformation program, and are stored into the list of the second argument. The identifier is stored into the overlapped list of the third argument as a removed element which is used when the judgment collation is established. The third paragraph judges the unremoved element by "?", and the store into the overlapped list of the third argument is not performed. The fourth paragraph is a part for processing the negative expression in the term of the condition part of the circuit transformation rule. Similarly to the second paragraph, both the third and fourth paragraphs place the identifier and the attribute of the element into the argument of "unify_frame" and execute the store into the list of the second argument. The fifth paragraph shows a process of storing the predicate into the list of the second argument in order to execute the predicate by the transformation program in the case where the predicate of "Prolog" for performing various condition judgments is described in the rule. The execution of the above-mentioned program produces the list of the "Prolog" predicate of the second argument, that is, the predicate for the various condition judgments which is described as "unify_frame()" in the rule and the element which is removed when the judgment collation is established. The predicate and the removed element are stored into the store section 45 for the later use in the transformation programs.

Figure 12:
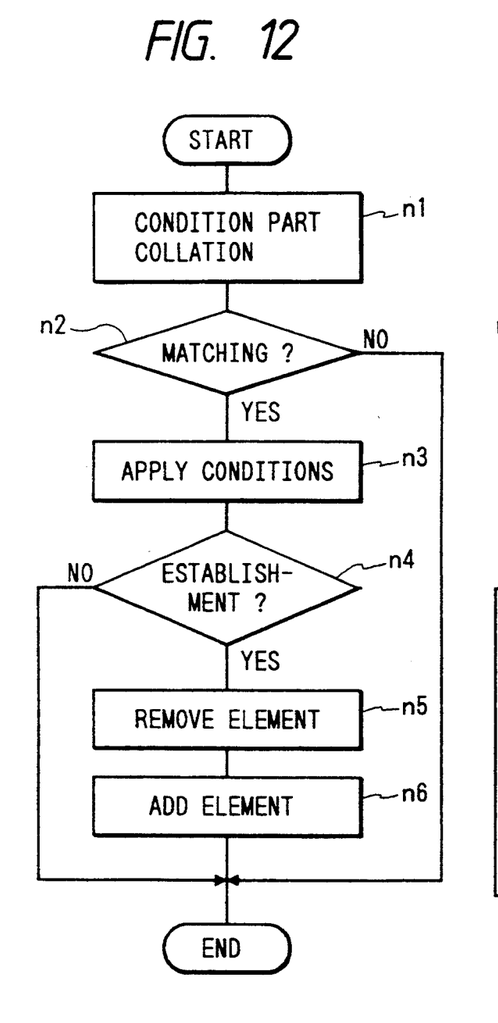
FIGS. 12 and 13 are flowcharts of examples of a circuit transformation program.

As described previously, the process of generating the transformation programs is executed by the step 76 of FIG. 9. During this process, transformation programs are generated for each of the circuit transformation rules on the basis of the circuit transformation rules and the analyzation result stored in the store section 45. The transformation programs generated by the program generating section 47 are executed and processed in a way such as shown in FIG. 12. At a step n1, the information of the circuit to be transformed is collated with the condition parts of the circuit transformation rules. A step n2 following the step n1 judges whether or not the information of the transformed circuit matches with the condition parts of the circuit transformation rules. When the information of the transformed circuit matches with the condition parts of the circuit transformation rules, the process advances from the step n2 to a step n3. When the information of the transformed circuit mismathces with the condition parts of the circuit transformation rules, the process is ended. In the step n3, other various conditions are applied. A step n4 following the step n3 judges whether or not the conditions applied in the step n3 are satisfied. When the conditions are satisfied, the process advances from the step n4 to a step n5. When the conditions are not satisfied, the process is ended. The step n5 removes an element. A step n6 following the step n5 adds an element. The operation by the steps n5 and n6 realizes a circuit transformation. After the step n6, the process is ended.

In the case of the circuit optimizing rule of FIG. 10, the transformation programs generated by the program generating section 47 have the following contents.

```
opt_rule(Gate1,(a_kind_of::nand:
        input:: [X1 | L1] ;output::Z)) :-
        perm( [X1 | L1], [X2 | L2]),
        length( [X1 | L1], N1),
        unify_frame((a_kind_of::inverter;
        input::Y;
        output::X1),Gate2),
        unify_frame((a_kind_of::nand;
        input:: [X2 | L2];
        output::Y),Gate3),
        length( [X2 | L2], N2),
        N1+N2=<6,
        append(L1, [X2 | L2], L3),
        remove_frames([Gate1,Gate2,Gate3]),
        add_frame((Gate4:::a_kind_of::nand;
        input::L3;
        output::Z)),
        !.
```

The process of the above-mentioned transformation programs is based on the process of FIG. 12. The transformation programs can be automatically generated by use of the result of the analyzation of the circuit transformation rules. In the above-mentioned transformation programs: "perm (L1,L2)" is a predicate for judging that the list L1 and the list L2 are in a permutation relation; "unify_frame(slots,Gate_name)" is a predicate for executing the judgment collation between the element in the circuit data with the element whose identifier is "Gate_name" and whose attribute is shown by "Slots"; and "add_frame(Gate)" and "remove_frames(Gates)" are predicates for executing the addition and removal of the elements of the argument.

Figure 13:
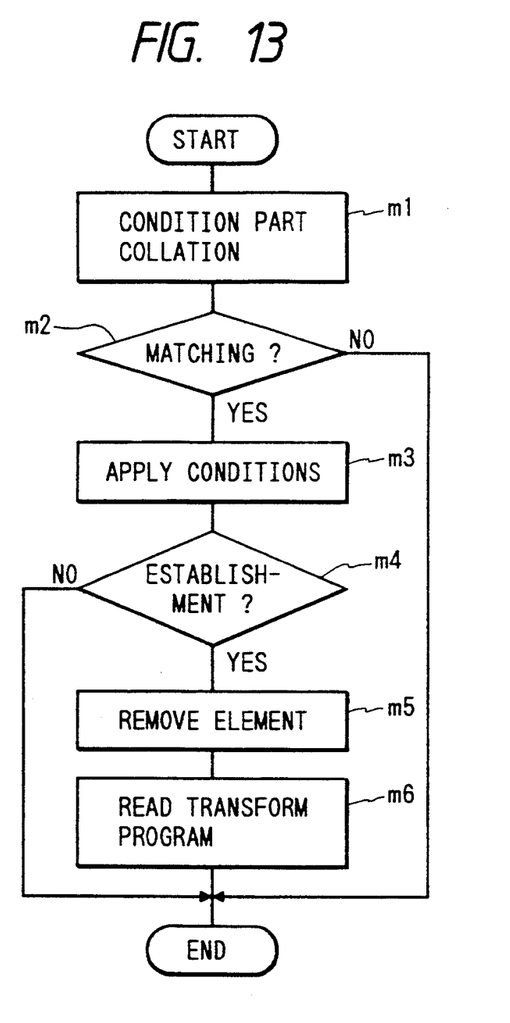

In some cases, a hierarchical relation is present between the circuit transformation rule groups stored in the section 21 of the storage device 4. Specifically, when the condition parts of the circuit transformation rules in the first rule group are satisfied, the group of the circuit transformation rules applied by the conclusion parts thereof is stored as a second rule group. The hierarchical relation between the first and second rule groups is indicated in the section 22 of the storage device 4. In these cases, the transformation programs compiled by the program generating section 47 are executed and processed in a way such as shown in FIG. 13. Steps m1–m5 of FIG. 13 execute operations similar to the operations executed by the steps n1–n5 of FIG. 12. In FIG. 13, after the step m5 removes an element to execute the circuit transformation, the step m6 reads out another transformation program corresponding to the transformation rules in the second rule group dependent on the first rule group so that the control is moved to the latter transformation program. In this way, the rule groups having the hierarchical relation are sequentially applied to execute the circuit transformation.

The step 72 of FIG. 9 analyzes the hierarchical relation, and the result of the analyzation is stored into the store section 45 and is used when the main rules in the first rule group are compiled into the transformation programs. Thus, the transformation programs of the sub rules are read out in the transformation programs of the main rules. In the above-mentioned example of the description of the transformation programs using "Prolog", this process is realized by writing the function or the predicate for reading the transformation programs of the sub rules into the portion corresponding to the predicate "add_frame" for adding an element in the conclusion part. The examples of the circuit transformation rules having the hierarchical relation are shown in FIGS. 3 and 4. The programming language "Prolog" used here may be replaced by another programming language such as "Lisp" or "C".

Figure 14:
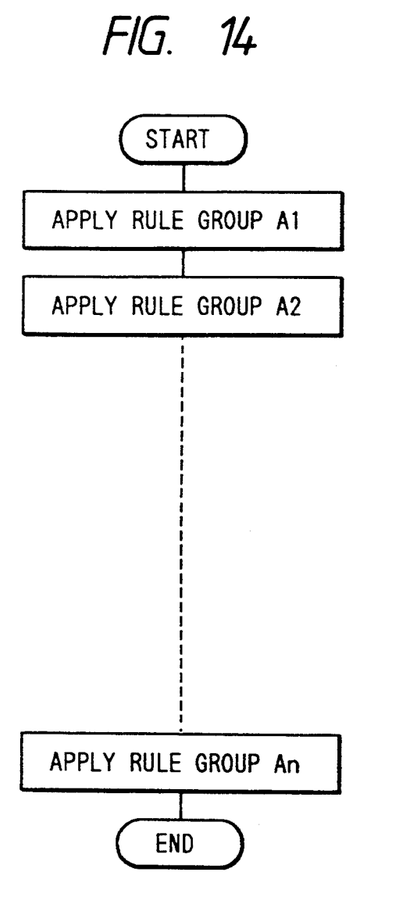
FIG. 14 is a flowchart of an example of a process of applying circuit transformation rules which is executed in accordance with a control program.
Figure 15:
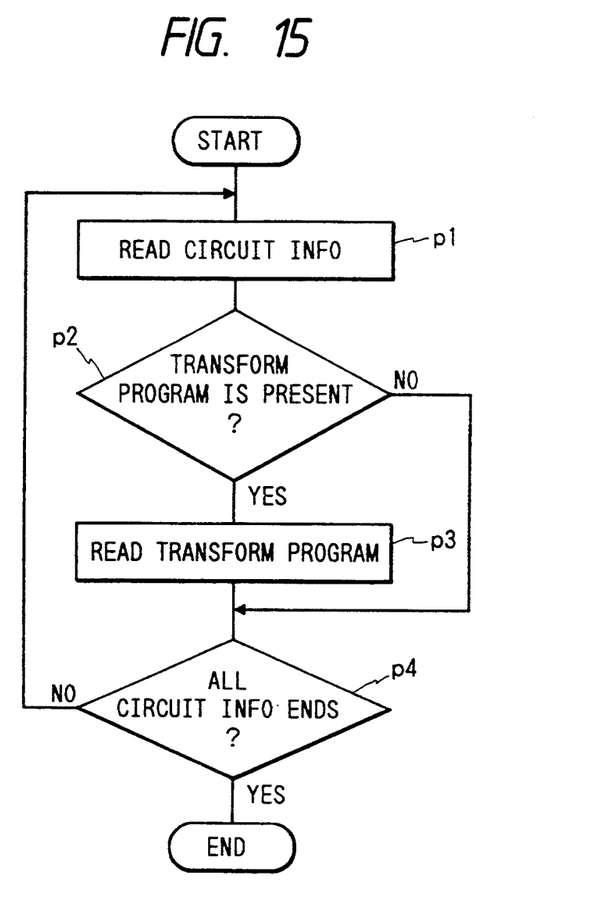
FIG. 15 is a flowchart of an example of a process of recurrently applying circuit transformation programs which is executed in accordance with the control program.
Figure 16:
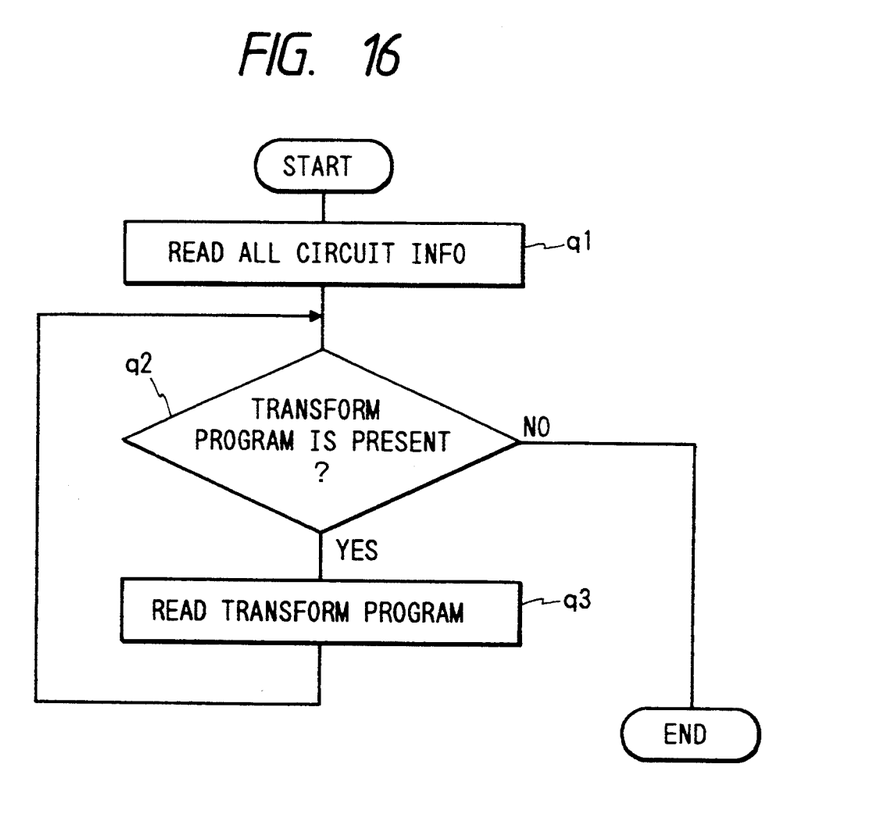
FIG. 16 is a flowchart of an example of a process of non-recurrently applying circuit transformation programs which is executed in accordance with the control program.

The process of generating the control programs will be explained hereinafter. FIGS. 14-16 are flowcharts of examples of the processes of the control programs generated in the step 79 of FIG. 9. In the process of FIG. 14, the applications of the circuit transformation rule groups A1-An are reiterated in the application order of the rule groups A1-An which is designated by the inference control knowledge. Each of the steps of the application of the respective rule groups A1-An in FIG. 14 is realized as shown in FIGS. 15 and 16. FIG. 15 shows the case where the circuit transformation rules are recurrently applied to the circuit data corresponding to the transformation result, that is, the case where the transformation programs compiled by the program generating section 47 are read out. FIG. 16 shows the case where the circuit transformation rules are not applied again to the data which are added and changed by the transformation.

In FIG. 15, a step p1 reads out the information of the circuit to be transformed. A step p2 following the step p1 judges whether or not there is a transformation program which suits to the readout circuit information. In the presence of the transformation program, the process advances from the step p2 to a step p3 which reads out the transformation program. In the absence of the transformation program, the process jumps from the step p2 to a step p4. After the step p3, the process advances to the step p4. The step p4 judges whether or not the circular information has been fully read out. When the circuit information has been fully read out, the process is ended. Otherwise, the program returns from the step p4 to the step p1. Accordingly, the transformation programs are sequentially read out and executed, and the circuit transformations are also sequentially performed. In addition, the operations by the steps p1-p4 are applied to the circuit information after the circuit transformation, so that the circuit transformation rules are recurrently applied. When there is no remaining circuit transformation rule which should be applied, the process is ended.

In the process of FIG. 16, the circuit transformation is carried out only once. Firstly, a step q1 reads out all the circuit information. A step q2 following the step q1 judges whether or not there is an applicable transformation program. In the presence of the transformation program, the process advances from the step q2 to a step q3 which reads out the transformation program. The readout transmission program is executed. In the absence of the transformation program, the process is ended. After the step p3, the process returns to the step q2. Accordingly, the steps q2 and q3 are reiterated until a remaining applicable transformation program becomes absent. Thus, the circuit transformation processes related to all the circuit information read out by the step q1 are executed completely. Since the circuit information is not read out again after the transformation, the circuit information which undergoes the circuit transformation once is not subjected to the circuit transformation process again.

As described previously, the compiling device 31 automatically generates the circuit transformation programs on the basis of the inference control knowledge and the circuit transformation rules. Thus, the following advantages are produced. Since the analyzation of the condition parts of the circuit transformation rules is executed by the compiling device 31, the speed of the transformation process can be high. The circuit transformation rules can be written in a simple format unnecessary to consider the mechanism of the process. The coding of complicated inference algorithm for the circuit transformation is unnecessary. Since the application method of the circuit transformation rules can be selected by the inference control knowledge, it is easy to realize the inference design system performing a suitable transformation process in compliance with the circuit transformation rules.

As described previously, the compiling device 31 compiles the circuit transformation rules into the circuit transformation programs by use of the inference control knowledge. The circuit transformation programs are linked with the already-existing programs to generate the logic design programs. By the execution of the logic design programs, the input circuit information is collated with the condition parts of the circuit transformation rules on the basis of the inference control knowledge. Thus, the circuit transformation rules for the optimal circuit transformation process can be found by searching at a higher speed and therefore the circuit transformation process can be performed at a higher speed in collation with a system where circuit transformation rules are analyzed by an interpreter on occasion.

The above-mentioned circuit transformation programs are generated while the optimal algorithm is determined by analyzing the circuit transformation rules and the inference control knowledge. Therefore, it is unnecessary to consider the inference way during the generation of the circuit transformation rules addition, the inference control knowledge can be made without considering the inference algorithm.

Since it is possible to flexibly generate the circuit transformation programs for executing a suitable inference dependent on the type of the circuit transformation rules, a logic design system for an arbitrary circuit transformation process can be easily constructed.

What is claimed is:

1. A logic design system for transforming input circuit information into other circuit information closer to an actually-provided element level, comprising:

means for storing signals representing a plurality of types of circuit transformation rules having condition parts and conclusion parts;

means for storing signals representing inference control knowledge including knowledge related to (a) a method of inferring the circuit transformation rules and (b) a relation between the circuit transformation rules;

means for compiling the signals representing circuit transformation rules into signals representing circuit transformation programs in response to the signals representing inference control knowledge;

means for storing signals representing the circuit transformation programs;

means for storing signals representing previously-existing programs including a procedural process of a logic design and various functions necessary for execution of the circuit transformation programs;

means for combining the signals representing the circuit transformation programs and the already-existing programs into the signals representing a logic design program;

means for storing the signals representing the logic design program; and means for executing a circuit transformation process in response to the signals representing the logic design program.

2. A logic design system comprising:

means for compiling signals representing predetermined circuit transformation rules into signals representing circuit transformation programs in response to signals representing a predetermined inference control knowledge, wherein the signals representing inference control knowledge include signals representing knowledge related to a method of inferring the circuit transformation rules and signals representing knowledge related to a relation between the circuit transformation rules;

means for combining the signals representing the circuit transformation programs and signals representing a predetermined base program into signals representing a logic design program, wherein the signals representing the base program include signals representing a procedural process of a logic design and signals representing predetermined functions usable for the logic design; and means for transforming signals representing information of a first circuit into signals representing information of a logically-designed second circuit in accordance with signals derived from the logic design program.

3. The logic design system of claim 2 wherein the compiling means comprises first analyzing means for analyzing signals representing condition parts of the circuit transformation rules, second analyzing means for analyzing signals representing the inference control knowledge, and means for generating the circuit transformation programs in response to signals representing a result of the analyzing by the first analyzing means, a result of the analyzing by the second analyzing means, the circuit transformation rules, and the inference control knowledge.

4. A method of making logic circuits with the aid of a digital processor; the processor having stored in it signals representing:

(1) a plurality of types of circuit transformation rules having condition parts and conclusion parts, (2) inference control knowledge including knowledge related to (a) a method of inferring the circuit transformation rules and (b) a relation between the circuit transformation rules, (3) previously-existing programs including a procedural process of a logic design and various functions necessary for execution of the circuit transformation programs, the method comprising:

activating the digital processor so it compiles the signals representing circuit transformation rules into signals representing circuit transformation programs in response to the signals representing inference control knowledge;

then storing in the processor the derived signals representing the circuit transformation programs;

then in the processor combining the signals representing the circuit transformation programs and the previously-existing programs into signals representing a logic design program;

then in the processor storing the signals representing the logic design program;

then in the processor executing a circuit transformation process in response to the stored signals representing the logic design program; and constructing logic circuits in response to the executed circuit transformation process.

5. A method of making logic circuits with the aid of a digital processor comprising:

activating the processor so it:

(a) compiles signals representing predetermined circuit transformation rules into signals representing circuit transformation programs in response to signals representing predetermined inference control knowledge, wherein the signals representing inference control knowledge include signals representing knowledge related to a method of inferring the circuit transformation rules and signals representing knowledge related to a relation between the circuit transformation rules;

(b) combines the signals representing the circuit transformation programs and signals representing a predetermined base program into signals representing a logic design program, wherein the signals representing the base program include signals representing a procedural process of a logic design and signals representing predetermined functions usable for the logic design;

(c) transforms signals representing information of a first circuit into signals representing information of a logically-designed second circuit in accordance with signals derived from the logic design program; and constructing logic circuits in response to the signals representing information of the logically-designed second circuit.

6. A method of making a logic circuit with the aid of a digital processor comprising activating the processor to:

(a) read circuit transformation rule groups from a section of a memory of the processor;

(b) select certain circuit transformation rules from the circuit transformation rule groups derived during step (a), the selected circuit transformation rules including conditional parts;

(c) analyze conditional parts of the selected transformation rules derived during step (b) by expanding conditional rules of circuit elements in the conditional parts of the circuit transformation rules to remove certain circuit elements from circuit configurations of the selected circuit transformation;

(d) store in a section of the memory analyzing results derived during step (c);

(e) compare the analyzing results stored in step (d) with further circuit transformation rules stored in a section of the memory, the further transformation rules being determined by an inferential method;

(f) execute a circuit transformation for each of the rules in which the analyzing results agree with the further rules in response to agreement of the comparing operation of step (e);

(g) detect whether or not a circuit transformation rule subsequent to a currently processed circuit transformation rule is present in the circuit transformation rule groups being read during step (a);

(h) return to step (b) and then repeat steps (c)-(g) in response to step (g) indicating the subsequent rule is present;

(i) detect whether or not a circuit transformation rule group subsequent to a currently processed circuit transformation rule is present in the section of memory read during step (a) in response to step (g) indicating the subsequent rule is not present;

(j) return to step (a) and then repeat steps (b)-(i) in response to step (i) indicating the subsequent circuit transformation rule group is present in the circuit transformation rule group read from memory during step (a);

(k) generate a control program for making the logic circuit in response to step (i) indicating the subsequent circuit transformation rule group is not present in the circuit transformation rule group read from memory during step (a); and (l) make the logic circuit in response to the generated control program.

* * * * *